United States Patent [19]
Drory

[11] Patent Number: 5,083,310
[45] Date of Patent: Jan. 21, 1992

[54] COMPRESSION AND EXPANSION TECHNIQUE FOR DIGITAL AUDIO DATA

[75] Inventor: Eatamar Drory, Santa Clara, Calif.

[73] Assignee: Apple Computer, Inc., Cupertino, Calif.

[21] Appl. No.: 436,547

[22] Filed: Nov. 14, 1989

[51] Int. Cl.$^5$ .............................................. G10L 3/00
[52] U.S. Cl. ...................................... 381/30; 375/27
[58] Field of Search ................................. 381/29-41; 364/513.5; 375/25-27, 122

[56] References Cited

U.S. PATENT DOCUMENTS

| | | | |
|---|---|---|---|
| 1,930,962 | 6/1978 | Ishiguro et al. | 375/27 |
| 4,319,082 | 3/1982 | Gilloire et al. | 375/27 |
| 4,354,273 | 10/1982 | Areseki et al. | 375/27 |
| 4,375,013 | 2/1983 | Cointot et al. | 375/27 |
| 4,592,070 | 5/1986 | Chow et al. | 381/31 |
| 4,751,736 | 6/1988 | Gupta et al. | 381/31 |

OTHER PUBLICATIONS

J. R. Boddie, J. D. Johnston, C. A. McGonegal, J. W. Upton, D. A. Berkley, R. E. Crochiere, and J. L. Flanagan. "Adaptive Differential Pulse-Code-Modulation Coding", The Bell System Technical Journal, vol. 60, No. 7, Sep. 1981, pp. 1546-1561.
B. Widrow, S. D. Stearns. Adaptive Signal Processing, Englewood Cliffs, N. J.: Prentice-Hall Inc., 1985, Particularly pp. 115-220 and 303-312.
N. S. Jayant, P. Noll. Digital Coding of Waveforms, Bell Telephone Laboratories, Inc. 1984, particularly pp. 99-116 and 141-145.
S. Haykin. Adaptive Filter Theory, Englewood Cliffs, N. J.: Prentice-Hall, Inc., 1986, particularly pp. 216-220.

Primary Examiner—Dale M. Shaw
Assistant Examiner—Michelle Doerrler
Attorney, Agent, or Firm—Blakely, Sokoloff, Taylor & Zafman

[57] ABSTRACT

A compression and expansion apparatus and method for compressing and expanding digital audio signals using adaptive differential pulse-coding-modulation for high fidelity music is described. The apparatus comprises a predictor, a first and second adder, a first and second adjuster, a quantizer, an inverse quantizer and a step-size adaptor. An input digital signal and predicted signal are added by the first adder, producing the difference between the two signals. The output of the first adder is coupled to the first adjuster which acts as a multiplier to alter the gain and normalize the signal. The signal is then quantized by the quantizer. The output of the quantizer is sent to both the inverse quantizer and the adaptor. The adaptor acts like an automatic-gain-control to control the gain provided by the first adjuster. After inverse quantization by the inverse quantizer, the signal is sent to the second adjuster to remove the effects of the first adjuster process, i.e. denormalize and remove gain. Then the signal is sent to the second adder to add back in the predicted signal removed by the first adder. Next the signal is outputted and sent to the predictor. The predictor uses the output signal to prepare another predicted signal for a subsequently inputted digital signal. Wherein, an inputted digital audio signal and a corresponding outputted digital audio signal are substantially similar.

21 Claims, 5 Drawing Sheets

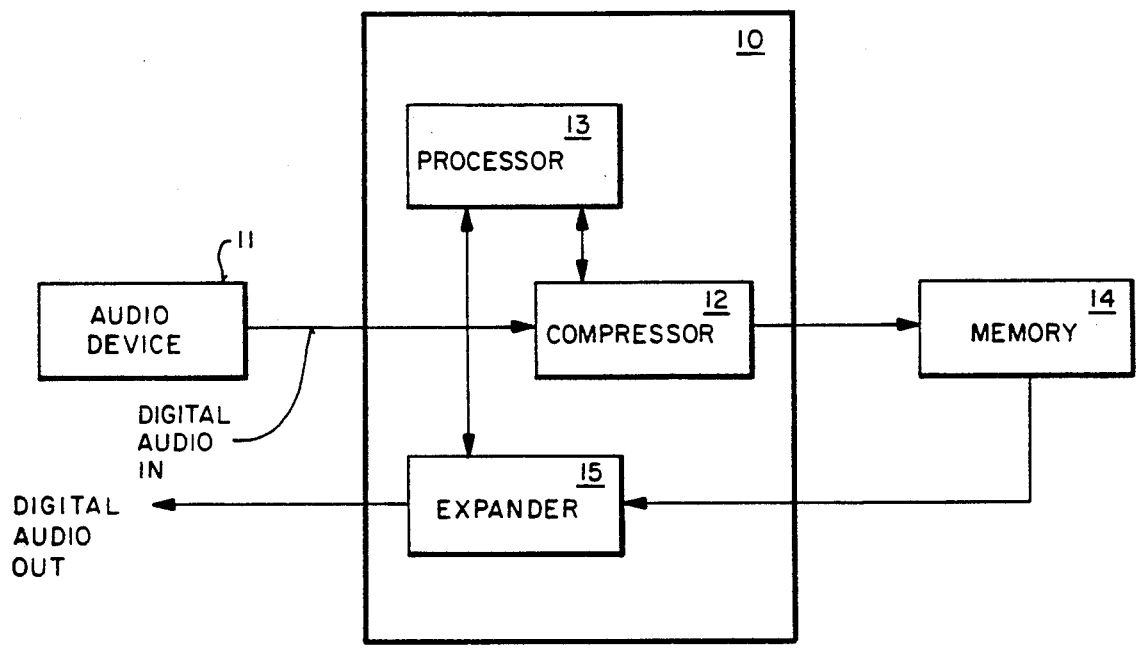
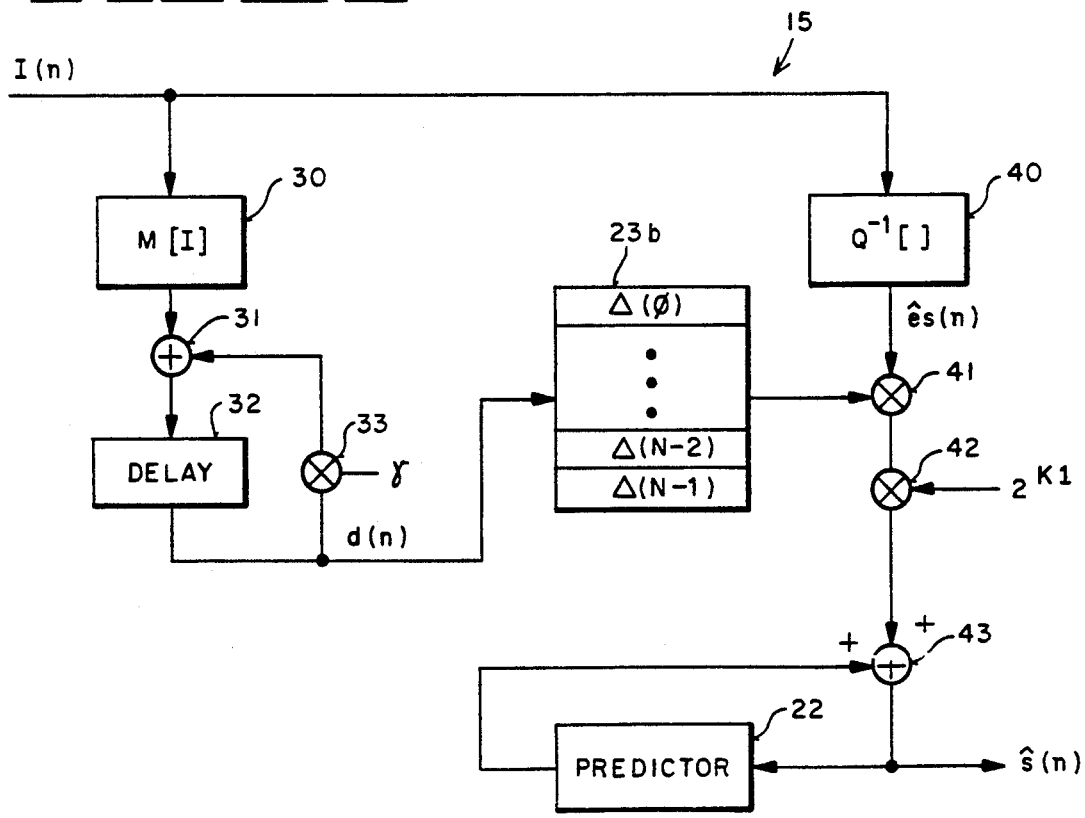

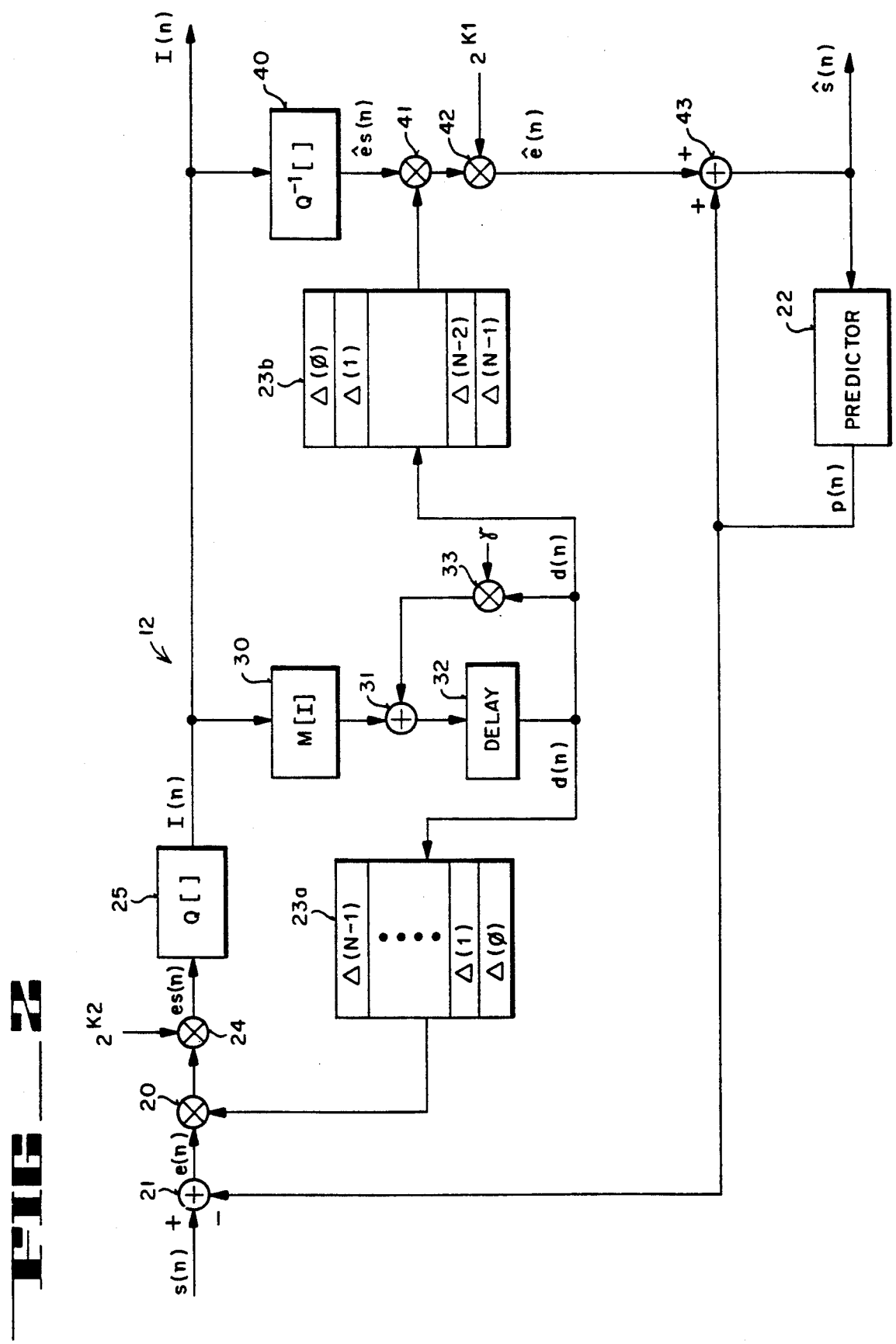
FIG._2

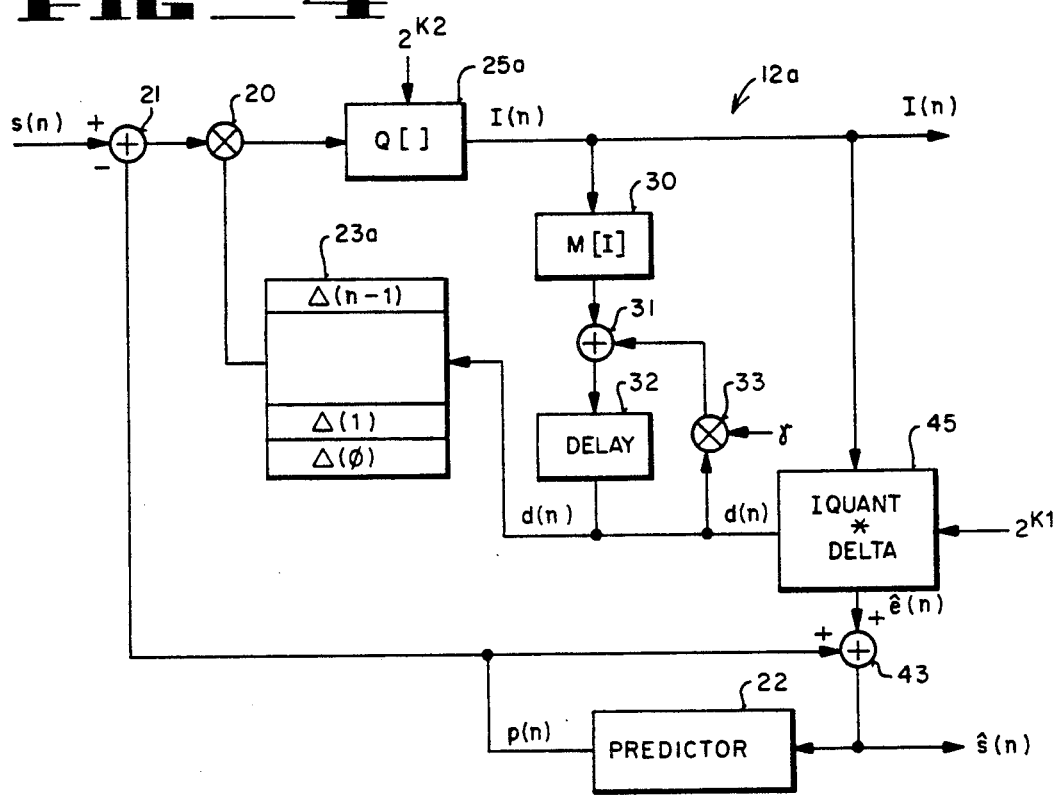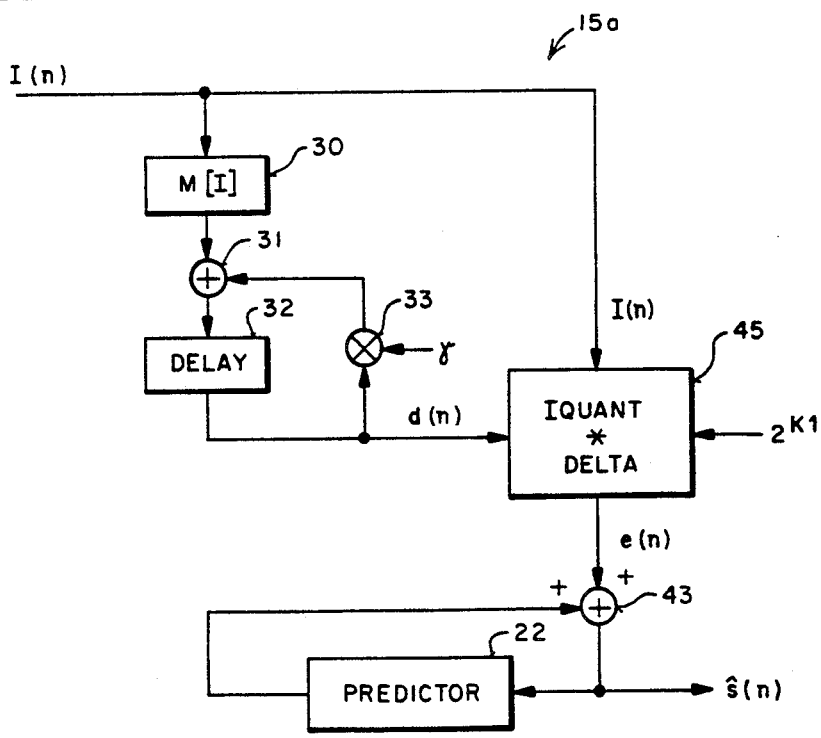

FIG_6
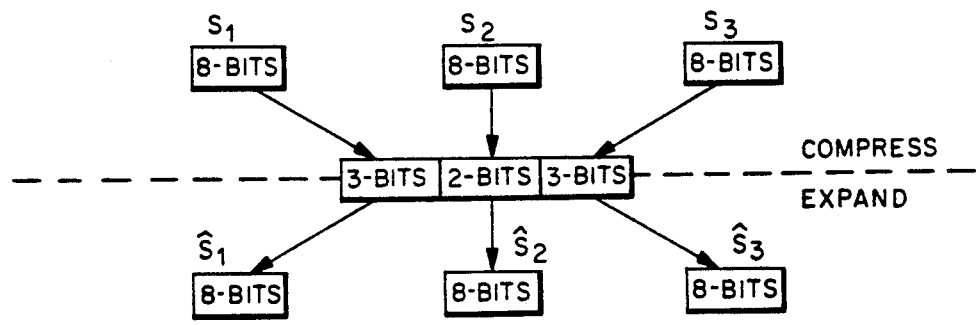
FIG_7
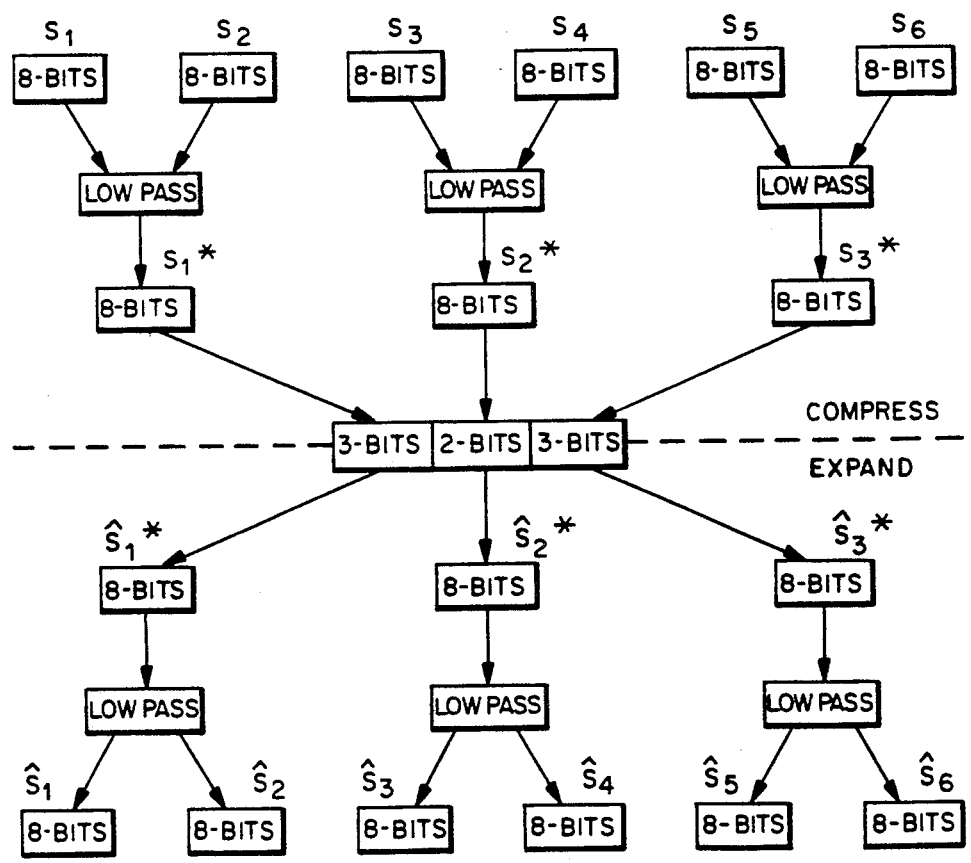

FIG_8
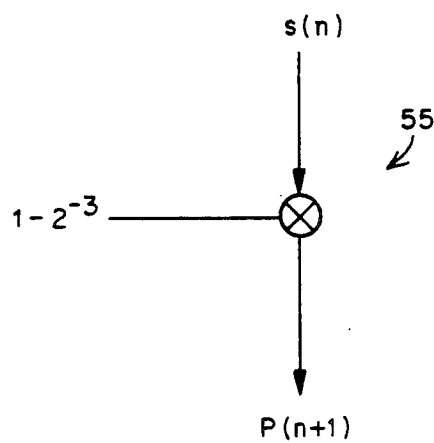
FIG_9
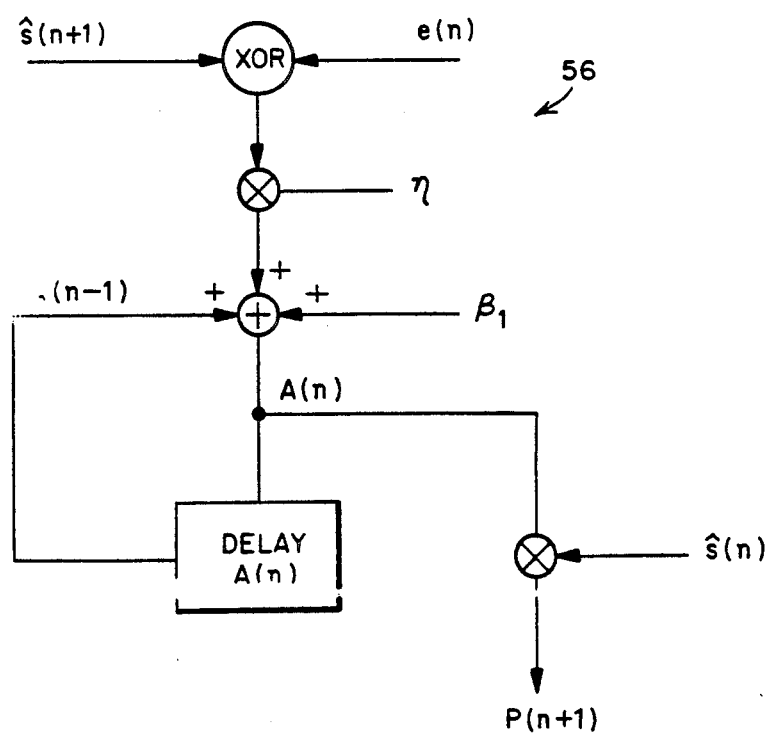

COMPRESSION AND EXPANSION TECHNIQUE FOR DIGITAL AUDIO DATA

BACKGROUND OF THE INVENTION

1. Field of the Invention

The present invention relates to the field of signal processing and, more particularly, to the compression and expansion of audio signals.

2. Prior Art

In the processing of audio information, compression and expansion techniques are utilized in order to speed the rate of transfer of the information, as well as reducing the amount of required memory space for storing the information.

Audio compression techniques decrease the amount of memory space required to store digitized audio information. It is to be noted that digitized audio information require significant amounts of memory for relatively short amount of recorded or play time. This requirement for large amounts of memory increases significantly when the audio information being stored is to have a quality equivalent to high fidelity music. For example, in one particular application, one minute of digitized audio speech requires approximately 0.5 megabytes of memory. However, when the digitized audio to be stored is to have a compact disc (CD)-quality for storing music, one minute of digitized music may require in the order of 5.3 megabytes. Thus, approximately ten times the memory space is required to store one minute of digitized CD quality music as compared to ordinary telephone-quality speech.

In order to store high fidelity (i.e. CD-quality) music, very large amounts of memory space is required to store the information. In order to reduce the required memory capacity, various audio compression techniques have been devised in order to compress the digitized audio information prior to storage. Audio expansion techniques are then utilized to retrieve the compressed data and expanding such data in order to reproduce the original audio for playback.

However, it is critical that the compression technique used does not lose or distort the original information appreciably. Further, the audio expansion technique used should also be capable of reproducing the originally stored music. Thus, an audio compression/expansion technique for storing high fidelity music must be capable of reducing the required memory capacity, but at the same time be capable of reproducing the original sound without appreciable loss or distortion.

Additionally, where such high fidelity music is to be processed at real-time, especially for playback, it is essential that the compression and expansion techniques not be overly complicated so that the data can be processed and stored, and later retrieved and processed for reproduction at real-time speeds.

It is appreciated that the audio compression/expansion techniques of the present invention processes and stores high fidelity music, and retrieves and reproduces such stored music at real-time speeds.

PRIOR ART REFERENCES

1. J. R. Boddie, J. D. Johnston, C. A. McGonegal, J. W. Upton, D. A. Berkley, R. E. Crochiere, and J. L. Flanagan. "Adaptive Differential Pulse-Code-Modulation Coding," *The Bell System Technical Journal*, Vol. 60, No. 7, September 1981, pp. 1546–1561.

2. B. Widrow, S. D. Stearns. *Adaptive Signal Processing*, Englewood Cliffs, N.J.: Prentice-Hall Inc. 1985, particularly pp. 115–220 and 303–312.

3. N. S. Jayant, P. Noll. *Digital Coding of Waveforms*, Bell Telephone Laboratories, Inc., 1984, particularly pp. 99–116 and 141–145.

4. S. Haykin. *Adaptive Filter Theory*, Englewood Cliffs, N.J.: Prentice-Hall, Inc., 1986, particularly pp. 216–220.

SUMMARY OF THE INVENTION

An audio compression and expansion technique for compressing and expanding a digital audio signal is described. A compressor of the present invention receives a digital audio signal and compresses this audio signal in a quantizer for generating a compressed digital data for storage in a memory device. Subsequently the stored information is retrieved and expanded in an inverse quantizer to reconstruct the original signal for output as a digital audio output signal.

The compressor of the present invention receives digital audio signal as an input and subtracts a predicted value to generate a difference signal which is subsequently gain adjusted and normalized. The normalized signal is then compressed in a quantizer to generate the compressed signal. The quantized signal is also used in a first feedback loop which essentially provides an automatic gain control function for selecting the appropriate value for providing gain control to the input signal. The compressed signal is also processed through a second loop in which the compressed signal is expanded for the purpose of deriving the reconstruction of the inputted signal. This reconstructed signal is provided to a predictor for predicting future sampling.

This second loop which reconstructs the original signal is utilized as an expander during the playback in which the stored compressed data is processed to reconstruct the original signal. The playback is performed at real-time speed.

Further, in order to provide for both the processing of speech and high fidelity music, the preferred embodiment uses a 3-to-1 compression/1-to-3 expansion scheme, as well as a 6-to-1 compression/1-to-6 expansion scheme, for processing speech and/or music. Each of these two schemes uses a 3-2-3 bit packing scheme, wherein dual routines in the quantizer and the inverse quantizer allow for a 16-bit (or 8-bit) to 3-bit compression/3-bit to 16-bit (or 8-bit) expansion and also for a 16-bit (or 8-bit) to 2-bit compression/2-bit to 16-bit (or 8-bit) expansion.

BRIEF DESCRIPTION OF THE DRAWINGS

FIG. 1 is a block schematic diagram showing the compressor and expander of the present invention.

FIG. 2 is a block schematic diagram of the compressor of the present invention.

FIG. 3 is a block schematic diagram of the expander of the present invention.

FIG. 4 is a block schematic diagram of the compressor of the preferred embodiment having the step-size table combined with the inverse quantizer.

FIG. 5 is a block schematic diagram of the expander of the preferred embodiment having the step-size table combined with the inverse quantizer.

FIG. 6 illustrates the 3-to-1 compression and 1-to-3 expansion of the scheme of the preferred embodiment.

FIG. 7 illustrates the 6-to-1 compression and 1-to-6 expansion scheme of the preferred embodiment.

FIG. 8 shows an implementation of a fixed predictor of the preferred embodiment.

FIG. 9 shows an implementation of an adaptive predictor of the preferred embodiment.

DETAILED DESCRIPTION OF THE PRESENT INVENTION

An audio compression and expansion scheme for processing high fidelity music is described. Specifically, an adaptive differential pulse-coding-modulation (ADPCM) is used. In the following description numerous specific details are set forth, such as specific frequencies and bit packing schemes, in order to provide a thorough understanding of the present invention. It will be obvious, however, to one skilled in the art that the present invention may be practiced without these specific details. In other instances, well-known methods are not described in detail in order not to unnecessarily obscure the present invention.

Referring to FIG. 1, a block schematic diagram showing an apparatus 10 of the present invention is shown. An audio signal is provided from an audio device 11. Device 11 may be of a variety of prior art devices, such as a compact disk, vinyl record, microphone, telephone, or ordinary speech. If the output of the audio device 11 is in digital form then the digital audio signal is provided as an input to a compressor 12. However, if the audio device 11 provides an analog audio signal, such as ordinary speech, then the analog audio signal is digitized prior to being coupled as an input to compressor 12. Various prior art devices, such as a digital-to-analog converter (DAC), can be used to convert the analog audio signal to a digital signal form. Compressor 12 is coupled to a processor 13 wherein compressor 12 operates in conjunction with processor 13 for processing the digital audio input. Once the digital audio data is compressed, the compressed digital audio is coupled to a memory 14 for storage.

When information is to be retrieved at a later time, such as for playback, the compressed digital audio data is retrieved from memory 14 and coupled to expander 15. Expander 15 is also coupled to processor 13 and operates in conjunction with processor 13 to expand the compressed audio data from memory 14. The compressed data is expanded in expander 15 to reconstruct the digital audio which was initially provided as an input to the compressor 12.

In the preferred embodiment, processor 13, compressor 12 and expander 15 are part of apparatus 10, which is a desktop computer. Specifically, apparatus 10 is a Macintosh TM brand computer manufactured by Apple Computer Inc. of Cupertino, Calif. It is to be appreciated that other desktop computers can be readily adapted to practice the present invention. Because memory 14 requires substantial amounts of memory for storing the digital information, it is a separate memory from the internal memory of the computer 10. However, memory 14 can be readily implemented within computer 10. Further, although FIG. 1 shows the audio input coupled to the compressor 12 and the digital audio output coupled from the expander 15, it is to be understood that both compressor 12 and expander 15 operate in conjunction with processor 13. Furthermore, as is actually implemented in the preferred embodiment, compressor 12 and expander 15 operate in unison to provide a unitary compressor/expander. Further, as is practiced in the preferred embodiment, compressor 12 and expander 15 are implemented in software, which operate with processor 13.

Referring to FIG. 2, the compressor 12 of FIG. 1 is shown in diagram form. A digital audio signal, shown as $S(n)$, is provided as an input to an adder 21. Adder 21 combines the input signal $S(n)$ and a prediction signal $P(n)$ to determine a difference of the two signals. $P(n)$ is provided as an output from a predictor 22, which operation is later described. Subtracting $P(n)$ from $S(n)$ provides for a difference signal $e(n)$, which designates the difference between the actual signal and the predicted signal. Essentially, the purpose of the predictor 22 is to remove the correlation between the current input sample and past samples. The difference signal $e(n)$ designates the input signal with the correlation removed.

Difference signal $e(n)$ is then coupled to a multiplier 20 and is combined with an appropriate gain value from a step-size look-up table 23a to provide an adjusted $e(n)$ signal as an output of multiplier 20. The adjusted $e(n)$ signal is coupled to be shifted by shifter 24, which shifting value is designated as $2^{k2}$. The output of shifter 24 is designated as $eS(n)$. Shifter 24 provides an appropriate amount of shifting to the adjusted $e(n)$ for the purpose of normalizing the signal prior to quantization. That is, step-size look-up table 23a operates as part of an automatic gain control (AGC) unit to increase or decrease the gain of the signal $e(n)$ depending on its value (actually, the value of the past signal). Shifter 24 then provides the requisite shifting (amplification) in order to provide a normalized signal for quantization.

In actual practice, multiplier 20 and shifter 24 operate in unison as a single unit to provide a gain adjusted normalized $eS(n)$ signal. The delta ($\Delta$) values of table 23a contain values that have magnitudes which are less than one. The k2 value is set to a value greater than one so that the gain adjustment provided by table 23a to the differential signal $e(n)$ in combination with the shifted amount provided by the $2^{k2}$ shifting generates a normalized and gain adjusted signal $eS(n)$.

In reference to step-size look-up table 23a, it is to be understood that each entry has a value which is a step multiple of the previous entry. Further, the entries are provided in logarithmic format so that the actual multiplication by multiplier 20 is achieved by gain calculations provided by the entries. The logarithmic structure of table 23a allows for a fast AGC response in selecting and using the gain value to adjust the gain of the signal $e(n)$. Table 23a of the present invention is comprised of 128 entries, $\Delta(0)$ through $\Delta(127)$. The values selected for the entries of $\Delta(n)$ have a special reciprocal relationship, which relationship will be further described later.

The output of shifter 24 is coupled as an input to a quantizer 25. The quantizer 25 takes the normalized difference signal $eS(n)$ and performs a function $Q[eS(n)]$. Function $Q[]$ is quantization function for compressing the signal $eS(n)$. The compression is performed by the quantization function of quantizer 25. Techniques for performing quantization are well known in the prior art (see *Digital Coding of Waveforms* reference of N. S. Jayant et al. and *Adaptive Signal Processing* reference of Widrow et al., specifically in Chapter 4). As described in Chapter 4 of the Widrow et al. reference, various probability distributions can be used to implement the quantizer 25 of the present invention. The prior art reference describe the use of uniform, gaussian, laplacian and gamma distributions. Although a variety of these prior art probability distributions can be used in providing the operation of the quantizer 25, the preferred embodiment uses a gaussian distribution curve having a unique standard deviation ($\sigma$). The $\sigma$ of the preferred embodiment has been calculated to provide an optimum performance. That is, the quantizer $\sigma$ (and therefore the variance $\sigma^2$) is optimized to match the $\sigma$ of the differential signal eS(n). In the preferred embodiment, $\sigma = 0.14$ for the 2-bit quantization and $\sigma = 0.15$ for 3-bit quantization. The mean ($\mu$) is 0.

The output from the quantizer 25 is a compressed signal I(n) which is then provided to the memory 14 for storage. The actual bit packing scheme can be varied to provide n-bit packing as will be described later. The present invention uses a dual packing scheme to provide a 2-bit and a 3-bit packing from a 16-bit or an 8-bit signal.

In order to process the subsequent input S(n+1), I(n) is also used as an input to two other internal loops of the compressor 12. The first loop couples signal I(n) as an input to a step-size adaptation table 30, having the operation of performing the function M[I(n)]. Table 30 essentially operates to provide a rapid automatic gain control (AGC), wherein the gain is increased if signal I(n) has a low amplitude, and vice versa. The gain control function provided by adaptation table 30 is well known in the prior art. One such scheme for providing a prior art adaptation table M[I(n)] is described in *The Bell System Technical Journal* reference at page 1552-1553. A second commonly used table for providing such a step-size adaptation table is the CCITT standard table. The present invention provides a unique table for providing optimum quality for general audio gain control. It is to be appreciated that various other tables can be readily adapted for use as adaptation table 30 of the present invention.

The output of the step-size adaptation table 30 is coupled to a control loop comprised of adder 31, delay 32 and a logrithmic scaler 33. The output of adder 31 is time-delayed by delay 32, which output is designated d(n). The delay period within delay 32 is typically one sample delay period. Signal d(n) is then coupled to scaler 33, wherein d(n) is multiplied by a scaling factor $\delta$ and the scaled signal $\delta$d(n) is coupled as an input to adder 31. As practiced in the preferred embodiment, $\delta$ has a value of less than one (actually a value of $1-2^{-5}$) and its purpose is primarily to provide circuit protection against channel error. That is, $\delta$ is used as a damping factor to remove noise or other error introducing signals. In effect, multiplying d(n) by the factor $\delta$ it will remove the channel error in the compressor 12 so that compressor 12 will recover after a number of samples. With the value $1-2^{-5}$, the preferred embodiment recovers completely approximately after 100 samples. It is to be noted that channel error can be caused by the "cut-and-paste" gap caused by the expansion of the compressed signal or it can be a real error, such as noise, corrupt reading of the memory, loss of information or reading of non-audio information as audio information.

Signal d(n) is also coupled to table 23a for selecting one of the entries therein. The selection of the entry within table 23a is for the purpose of providing the AGC loop. Thus table 30 provides the gain control determination and generates a pointer d(n) which selects an entry in table 23a. The operation of the AGC loop can be shown by the equation:

$$d(n+1) = \delta d(n) + M[I(n)].$$

Thus, because d(n) is a pointer to the logrithmic table 23a, and operation on d(n) is basically a logrithmic operation. Thus, adding M[I(n)] to d(n) is equivalent to multiplying $\Delta$(n) if M[I(n)] is positive, or dividing if negative.

Signal d(n) is also coupled to an inverse look-up table 23b for the purpose of selecting one of the entries within table 23b. Table 23b has the same entries as table 23a, but in reverse order for selection. Actually in the practice of the present invention, table 23a and table 23b are actually a single table, wherein the entry function is performed in inverse order by pointer d(n). The use of entries in table 23b is for the purpose of undoing the normalization provided for the compression during the expansion stage.

The compressed signal I(n) is coupled through a second loop for the purpose of generating the signal P(n) at the output of predictor 22. Signal I(n) is coupled as an input to an inverse quantizer 40. Inverse quantizer 40 provides the inverse function $Q^{-1}[]$ to the input signal I(n). Inverse quantizer 40 provides the quantizing function, which is the inverse of that function $Q[]$ provided by quantizer 25. The function of the inverse quantizer 40 is to provide an expansion function to the compressed signal I(n). The output of the inverse quantizer 40 is the signal êS(n). (The ^ designation above the e indicates that this is a restored or a reconstructed signal equivalent to eS(n)). That is, êS(n) is reconstructed from signal I(n) and is thus equivalent to the signal eS(n), but may include small amounts of distortion or noise due to the quantization and inverse quantization operations. That is:

$$eS(n) = Q^{-1}[Q[eS(n)]], \text{ so that}$$

$$eS(n) - eS(n) = N, \text{ which is quantization noise.}$$

The output of the inverse quantizer 40 is coupled to a multiplier 41. Because signal êS(n) is normalized, it now needs to be denormalized and shifted to provide a reconstructed difference signal ê(n). The signal êS(n) is coupled as an input to the multiplier 41 and is multiplied by an entry from table 23b. The selected entry within table 23b is the inverse of the entry within table 23a so that the original denormalized value is recovered. The output of multiplier 41 is coupled to shifter 42 which shifts the signal accordingly. The shifting is determined by the value $2^{k1}$, so that the output of shifter 42 provides the signal ê(n). Because table 23b provides a reciprocal entry to that of table 23a, the ultimate function of multiplier 41 and shifter 42 is to provide a divider, which dividing function is the inverse of that provided by the multiplier 22 and shifter 24 at the input of the compressor 20. It is to be noted that shifters 42 and 24 shift in the same direction, simply because the tables 23a and 23b also shift in the same direction.

In equation terms:

$$\hat{eS}(n) = eS(n) + N, \text{ where N is the quantization noise;}$$
and $$\hat{eS}(n) = e(n)^*\text{GAIN, where GAIN} = 2^{k2}*\Delta(n); \text{ so that}$$

$$\hat{eS}(n) = e(n)^*\text{GAIN} + N; \text{ and}$$

$$e(n) = eS(n)/\text{GAIN}.$$

The result is:

$$\hat{e}(n) = [e(n)^*\text{GAIN} + N]/\text{GAIN} = e(n) + N/\text{GAIN}.$$

Thus, the reconstructed difference signal ê(n) differs from e(n) by N/GAIN. Also, as is noted, the overall loop gain from input to output is unity (1).

The output of shifter 42 is coupled as an input to adder 43. The signal P(n) from predictor 22 is also coupled as an input to adder 43 and is added to signal ê(n) for the purpose of generating the signal Ŝ(n). The signal Ŝ(n) is the reconstructed signal equivalent to the input signal S(n) but with the addition of noise. Thus Ŝ(n)=S(n)+N. The ^ again is used to designate that some amount of distortion or noise may be present so the reconstructed signal is not an exact replication of the input signal S(n). It is to be noted that in most techniques using a compressor and/or an expander for processing signals, quantization noise, as well as other distortions, will likely be introduced. The signal Ŝ(n) is the reproduced digital audio output signal. The signal Ŝ(n) is also coupled as an input to predictor 22 for generating the signal P(n+1).

Predictor 22 is comprised of a first order finite impulse response (FIR) filter using stochastic gradient techniques for estimating the next sample based on the previous samples. Fixed or adaptive predictors can be used for predictor 22 for predicting the next sample. Predictor 22 of the present invention uses a well-known technique, such techniques being described in *Digital Coding of Waveforms* reference at pages 303-312 and *Adaptive Filter Theory* at page 216. The function of the predictor 22 is to remove correlation from the input signal prior to quantization, in order to reduce the signal component that is to be quantized. Because the noise generated is relative to the signal amplitude, a lower noise is generated. Because the correlation coefficients are provided by predictor 22 in order to perform the quantization, those same values are recovered by the inverse quantization function. It is to be appreciated that various prior art techniques, other than those described in the references, can be readily adapted to provide the predictor function of predictor 22.

The output P(n) from predictor 22 is coupled as an input to adders 21 and 43. Adder 21 provides the difference function:

$$S(n)-P(n)=e(n).$$

Adder 43 provides the inverse function:

$$\hat{e}(n)+P(n)=\hat{S}(n)$$

Thus, compressor 12 receives a digital audio signal as an input S(n) and generates a compressed signal I(n) for storage. Compressor 12 also generates the reconstructed signal Ŝ(n) which is used as an input to predictor 22 for generating the values for subsequent sampling. The compressed signal I(n) is coupled to the memory 14 for storage and later playback.

Referring to FIG. 3, an expander 15 of the present invention is shown. It is to be noted that the various units 22, 23b, 30-33, and 40-43 which were described in reference to FIG. 2 for the compressor, are again used for the purpose of expanding the stored signal I(n). As was previously described in detail in reference to FIG. 2, the signal I(n) is processed in the second loop of compressor 12 for generating the signal Ŝ(n) as an input to predictor 22. This same technique is now used for processing the stored signal I(n) to reconstruct the signal Ŝ(n). The first loop is also used in processing the stored signal I(n) to select the appropriate d(n) pointer for selecting an entry in table 23b, which entry is inverse to that of table 23a that was used for gain adjustment during compression. Thus, expander 15 uses units 22, 23b, 30-33, and 40-43 in the same manner as was described in FIG. 2 to receive the stored signal I(n) for expanding it and generating the reconstructed signal Ŝ(n). It is to be appreciated that the expander 15 of the preferred embodiment actually uses those same units which were used in compressor 12.

It is to be noted that in the practice of the present invention, the overall input to output gain is unity. In equation terms:

$$\Delta(n)*2^{k2}*\Delta(N-n)*2^{k1}=1,$$

wherein the reconstructed signal Ŝ(n) is to have the same amplitude as the input signal S(n). Because the first two values of the above equation combine to provide a normalized input to quantizer 25, both of these operations can be readily incorporated into one. Conversely, the last two terms, designating the operation performed on the output of the inverse quantizer 40, can also be combined into one operation to "denormalize" the output of the inverse quantizer 40. The preferred embodiment takes advantage of this aspect and combines table 23b and multiplier 41 and shifter 42 as part of the inverse quantization table 45. Also, shifter 24 is combined with quantizer 25, as is shown in FIG. 4. Further, the preferred embodiment selects the values of 5 for k2 and a value of 3 for k1. Therefore $\Delta(n)*\Delta(N-n)=2^{-8}$.

Referring to FIG. 4, compressor 12 of the present invention is shown but wherein inverse quantization table 45 provides the function of the units 23b, 40-42 of the compressor 12 of FIG. 2. The inverse quantization routine within unit 45 provides the needed entries for the inverse step-size look-up table 23b, as well as the logarithmic subtraction (arithmetic division) and shifting in order to minimize the time required to expand the signal I(n). The techniques for providing inverse quantization are described in the aforementioned references.

However, it is to be noted that the preferred embodiment combines the various units within table 45 in order to reduce the actual computation time needed to generate ê(n) from I(n). The inverse quantization calculation takes into account the multiplication provided by multiplier 41 and shifting provided by shifter 42, as well as the entry values of table 23b. Thus to process I(n), only d(n) need be known as an input to inverse quantizer 45, which is in table form. Thus significant time savings is achieved in generating ê(n), especially since the one multiplication step (of multiplier 41) is removed.

Accordingly, in FIG. 5 an expander 15a of the preferred embodiment is shown in which units 22, 30-33, 43 and 45 are utilized to provide for the reconstruction of the audio signal from the compressed signal. As was described earlier in reference to FIG. 3, expander 15a utilizes that portion of the reconstruction loop of compressor 12a. Because of the significant time savings provided by inverse quantizer 45, expansion during playback is performed in real-time.

In actual practice, the preferred embodiment shown in FIGS. 4 and 5 is implemented in software, wherein programming routines provide for the operation of the various units of compressor 12a and expander 15a. Routines within quantizer 25, inverse quantizer 45 and step-size adaptation table 30 provide for their respective operations required of these units. Further, because the actual multiplication is reduced to the operation performed by logarithms, no recursive multiplication operations are required by tables 23a–b in the compressor or expander of the preferred embodiment. Wherein recursive multiplication operations require considerable amount of time by the processor, the reduction of such multiplication operation in the expansion path of the preferred embodiment allows for real-time playback of the stored digital signals. Because of the combining of the look-up table 23b and units 41 and 42 within inverse quantizer unit 45, processing time is saved in this expander loop. This is especially advantageous during the playback period in which stored digital information is provided from memory 14 and processed by expander 15a, permitting high fidelity music to be played back from memory at real-time speed.

It is to be appreciated that the preferred embodiment is implemented to operate with a microprocessor based desktop computer, specifically the aforementioned Macintosh ™ brand computer, having a 68000 (or 68000 based) microprocessor manufactured by Motorola Corporation, but is not limited to such.

Additionally, the compressor 12a of the preferred embodiment utilizes a special bit packing scheme in order to provide for 3-to-1 compression as well as a 6-to-1 compression. The 6-to-1 compression compresses more data than 3-to-1, however the bandwidth is reduced by a factor of 2.

Referring to FIG. 6, a 3-to-1 compression and expansion technique is shown. In the 3-to-1 compression, three signals $S_1$, $S_2$ and $S_3$ are provided at the input of the compressor as sequential signals (or samples of signals). An 8-bit signal is shown in this example, however, the actual number of bits is a design choice. The three 8-bit signals are compacted into a sequence of bits for a 3-to-1 compression. That is, the 8-bit signal $S_1$ is compacted into three bits, the 8-bit signal $S_2$ is compacted into two bits and the 8-bit signal $S_3$ is compacted into the last three bits, giving an overall result of 24 bits being compacted into 8 bits to provide a 3-to-1 compression. The 1-to-3 expansion expands the 3-to-1 compaction to provide the reconstructed signals, $\hat{S}_1$, $\hat{S}_2$ and $\hat{S}_3$, and thereby providing the 1-to-3 expansion to arrive at the original signals. As stated previously, the compaction is provided by quantizer 25 and the expansion by the inverse quantizer 40.

It is to be noted that because two different bit packing schemes are utilized, two separate algorithms are implemented in quantizer 25. An algorithm for providing a 3-bit compaction is used to compact eight bits down to three bits, while a second algorithm for 2-bit compaction is utilized for compacting eight bits down to two bits. Equivalently, inverse quantizer 40 also has two separate routines, one for expanding the three bits to eight bits and a second for expanding the two bits to eight bits. Table 30 also has two separate routines for 2-bit and 3-bit schemes.

Referring to FIG. 7 a 6-to-1 compression/1-to-6 expansion scheme of the preferred embodiment is shown. In FIG. 7, six signal samples $S_1$–$S_6$ are shown, each having an 8-bit field. The same 3-bit and 2-bit routines which were described in reference to FIG. 6 is also used in the 6-to-1 compaction/1-to-6 expansion. However, in order to double the compaction ratio, a low pass filter is used to provide a decimation function to each pair of sampled inputs. Thus, prior to the signal being coupled as an input to adder 21, each pair of signals is coupled through a low pass filter to derive at a single 8-bit signal. Thus, in the example of FIG. 7, signals $S_1$ and $S_2$ are combined in a decimation operation in the low pass filter at the input of the compressor 12a to provide a single 8-bit signal $S_1^*$. Respectively, $S_2^*$ is derived from signals $S_3$ and $S_4$, and signal $S_3^*$ is derived from signals $S_5$ and $S_6$. Then the 3-2-3 compaction is provided by quantizer 25 in order to provide a 6-to-1 compression.

In the expansion mode the 3-2-3 compacted signal is processed by the inverse quantizer 40 to provide three 8-bit signals $\hat{S}_1^*$, $\hat{S}_2^*$ and $\hat{S}_3^*$. These three 8-bit signals are then coupled out from expander 15a and passed through a low pass filter for an inverse operation as that provided by the low pass filter at the input. The inverse operation known as interpolation recovers the six reconstructed 8-bit signals $\hat{S}_{1\text{-}6}$, thus providing a 1-to-6 expansion. It is to be appreciated that the decimation and compaction techniques are well-known in the prior art.

In actual practice, the order of packing the signals $S_1$–$S_3$ or $S_1$–$S_6$ can be changed and still practice the present invention. As such, in the 3-to-1 compaction, the compaction of signals $S_1$, $S_2$ and $S_3$ (8-bits each) are compacted and stored as $S_3$-$S_2$-$S_1$ (3-2-3). As long as the expansion routine accounts for and compensates for this reverse order, the outcome is the same.

Further, it is to be appreciated that the 8-bit signals of FIGS. 6 and 7 are provided for illustrative purpose. In actual practice, the compressor and expander of the preferred embodiment are comprised of routines for operating on 16-bit signals to provide a 6-to-1 and a 12-to-1 compression/1-to-6 and 1-to-12 expansion. However, when 8-bit signals are present, such as shown in FIGS. 6 and 7, eight additional bits are padded (thereby providing a 16-bit signal) for operation by the 16-bit routines. Yet, because of the place-holding function of the padded 8-bits, the result is a 3-to-1 and 6-to-1 compression/1-to-3 and 1-to-6 expansion as illustrated in FIGS. 6 and 7.

Referring to FIG. 8, a predictor 55 which is used as predictor 22 when performing the 3-to-1 compression/1-to-3 expansion is shown. Predictor 55 is a fixed predictor wherein signal $\hat{S}(n)$ is operated on by a fixed value $1-2^{-3}$, such that:

$$P(n+1) = \hat{S}(n) \cdot (1-2^{-3})$$

Referring to FIG. 9, a predictor 56 which is used as predictor 22 when performing the 6-to-1 compression/1-to-6 expansion is shown. Predictor 55 is an adaptive predictor wherein P(n+1) is a function of both the current signal S(n) and the past signal S(n−1) The exclusive OR (XOR) operator provides the sign comparison of the signals S(n−1) and e(n), and multiplies the value $\eta$. This result is added to A(n−1) and $\beta_1$ to generate A(n), which is then multiplied by $\hat{S}(n)$. The equation for performing the function of predictor 56 is:

$$A(n) = A(n-1) + \text{sign}[\hat{S}(n-1)] * \text{sign}[e(n)] * \eta + \beta_1$$

and $\hat{S}(n) = \hat{e}(n) + P(n)$ so that $P(n+1) = A(n) * \hat{S}(n)$

In the preferred embodiment, $\eta = 0.0125$ and $\beta_1 = 0.75$.

It is to be appreciated that other predictors can be readily used for predictor 22 of the present invention without departing from the spirit and scope of the present invention. However, it is to be noted that the preferred embodiment used these specific predictors 55 and 56 for a particular purpose.

The adaptive predictor 56 yields a more optimized result than the fixed predictor 55, but requires more time to produce the result. Thus, if the adaptive predictor 56 was implemented with the 3-to-1 compression/1-to-3 expansion, real-time playback could not be achieved with the 68000 based microprocessors used. This anomaly steps from the fact that the operation of the low pass filters requires less time than the quantizer routines. Thus the operation of passing two signals through a low pass filter and quantizing the combined result (as is done in the 6-to-1 scheme) takes less time than quantizing the first signal and then quantizing the second signal (as is done in the 3-to-1 scheme). The expansion of the two signals is done in reverse steps. Therefore, the less time required for processing a pair of signals permits a more time consuming predictor to be used for the 6-to-1 scheme.

Thus an apparatus and a method for providing compression/expansion of digital audio is described.

I claim:

1. An apparatus for compressing and expanding a digital audio signal, comprising:

predictor means for providing a first predicted signal of a first inputted digital audio signal;

first adder means coupled to receive both said first inputted digital audio signal and said first predicted signal for providing a first difference signal, said first difference signal representing a difference between said first inputted digital audio signal and said first predicted signal;

first adjustment means coupled to receive said first difference signal for applying a first gain value to said first difference signal in order to adjust the magnitude of said first difference signal and for normalizing said first difference signal, said first adjustment means providing an output being a first adjusted difference signal and having at least one look-up table;

quantizer means coupled to said first adjustment means for quantizing said first adjusted difference signal in order to provide a compressed signal which corresponds to a quantized compression of said first inputted digital signal;

adaptive means coupled to receive said compressed signal for evaluating said compressed signal to determine if the magnitude of said compressed signal is at a predetermined value, said adaptive means including an adaptation table, said adaptation table coupled to receive said compressed signal for providing a first pointer to said one look-up table, said one look-up table having gain value entries, each said gain value entry being a step multiple of a previous said gain value entry, said first pointer pointing to one of said gain value entries in said one look-up table for selecting said first gain value, said one look-up table coupled to said first adjustment means for supplying said first gain value;

inverse quantizer means coupled to receive said compressed signal for providing an inverse quantization operation to expand said compressed signal into a second adjusted difference signal, said second adjusted difference signal being substantially equivalent to said first adjusted difference signal;

second adjustment means coupled to receive said second adjusted difference signal for applying a second gain value and for denormalizing said second adjusted difference signal, said second gain value being a said gain value entry from said one look-up table indicated by said first pointer, said second adjustment means coupled to said adaptive means to receive said second gain value, said second gain value is a reciprocal of said first gain value, said second adjustment means output being a second difference signal substantially equivalent to said first difference signal;

second adder means coupled to receive both said second difference signal and said first predicted signal for providing a first outputted digital signal, said first outputted digital signal representing a sum of said second difference signal and said first predicted signal, said first outputted digital signal being substantially equivalent to said first inputted digital signal; and wherein said predictor means coupled to receive said first outputted digital signal for generating a second predicted signal.

2. The apparatus of claim 1 wherein said quantizer means and said inverse quantizer means operate in unison to provide a unitary compresser/expander.

3. The apparatus of claim 2 wherein said first gain value is provided by said first pointer pointing to an entry in said one look-up table.

4. The apparatus of claim 3 wherein said first and second adjustment means includes at least one shifter means each for providing the appropriate amount of shifting for normalizing and denormalizing, respectively.

5. The apparatus of claim 4 wherein said first and second shifting means normalize with said first and second normalizing values and said first and second gain values such that the overall gain relative to said first inputted digital signal and said first outputted digital signal is one.

6. An apparatus for compressing a digital audio signal to a compressed signal, storing said compressed signal in a memory, retrieving said compressed signal from said memory and expanding said compressed signal to reconstruct said digital audio signal for real-time playback, comprising:

input means coupled for receiving a first inputted analog audio signal;

first conversion means for converting said first inputted analog audio signal into a first inputted digital audio signal;

predictor means for providing a first predicted signal of said first inputted digital audio signal;

first adder means coupled to receive both said first inputted digital audio signal and said first predicted signal for providing a first difference signal, said first difference signal representing a difference between said first inputted digital audio signal and said first predicted signal;

first adjustment means coupled to receive said first difference signal for applying a first gain value to said first difference signal in order to adjust the amplitude of said first difference signal and for normalizing said first difference signal, said first adjustment means including shifter means for providing the appropriate amount of shifting for normalizing said first difference signal, said shifter means operating using a first normalizing value in order to normalize the amplitude of said first difference signal, said first adjustment means output being a first adjusted difference signal;

quantizer means coupled to said first adjustment means for quantizing said first adjusted difference signal in order to provide a compressed signal which corresponds to a quantized compression of said first digital signal;

memory means coupled to receive said compressed signal for storing said compressed signal;

adaptive means coupled to receive said compressed signal for evaluating said compressed signal to determine if the amplitude of said compressed signal is at a predetermined value, said adaptive means including an adaptation table and at least one look-up table, said adaptation table coupled to receive said compressed signal for providing a first pointer to said one look-up table, said one look-up table having gain value entries, each said gain value entry being a step multiple of a previous said gain value entry, said first pointer pointing to one of said gain value entries in said one look-up table for selecting said first gain value, said one look-up table coupled to said first adjustment means for supplying said first gain value;

retrieval means coupled to said memory means for retrieving said compressed signal;

inverse quantizer means coupled to receive said compressed signal from said memory means after retrieval by said retrieval means for providing an inverse quantization operation to expand said compressed signal into a second adjusted difference signal, said second adjusted difference signal being substantially equivalent to said first adjusted difference signal, wherein said quantizer means and said inverse quantizer means operate in unison to provide a unitary compresser/expander;

second adjustment means coupled to receive said second adjusted difference signal for applying a second gain value and for denormalizing said second adjusted difference signal, said second gain value being said one of said gain value entries from said one look-up table indicated by said first pointer, said second adjustment means coupled to said adaptive means to receive said second gain value, wherein said second gain value is a reciprocal of said first gain value, said second adjustment means including shifter means for providing an appropriate amount of shifting for denormalizing said second adjusted difference signal, said shifter means operating using a second normalizing value in order to denormalize the amplitude of said second adjusted difference signal, said second adjustment meas output being a second difference signal substantially equivalent to said first difference signal;

second adder means coupled to receive both said second difference signal and said first predicted signal for providing a first outputted digital audio signal, said first outputted digital audio signal representing a sum of said second difference signal and said first predicted signal, said first outputted digital audio signal being substantially equivalent to said first inputted digital audio signal;

said predictor means coupled to receive said first outputted digital audio signal for generating a second predicted signal;

second conversion means coupled to receive said first outputted digital audio signal for converting said first outputted digital audio signal to a first outputted analog audio signal; and output means coupled to receive said first outputted analog signal for outputting said first outputted analog signal, wherein said first outputted analog audio signal is substantially similar to said first inputted analog audio signal.

7. The apparatus of claim 6 wherein said first gain value is provided by said first pointer pointing to an entry in said one look-up table.

8. The apparatus of claim 7 wherein said first adjustment means provides logarithmic additions of said first gain value to said first difference signal.

9. The apparatus of claim 7 wherein said second adjustment means provides logarithmic addition of said second gain value to said second adjusted difference signal.

10. The apparatus of claim 7 wherein said first and second shifting means normalize with said first and second normalizing values and said first and second gain values such that the overall gain relative to said first inputted digital signal and said first outputted digital signal is one.

11. The apparatus of claim 7 wherein said quantizer means includes at least two quantizing routines for compression of said first adjusted difference signal, one of said quantizing routines provides n-bit compaction, while a second of said quantizing routines provides m-bit compaction, said m-bit compaction different in bit length from said n-bit compaction; and wherein said inverse quantizer means includes at least two quantizing routines for expansion of said compressed signal, one of said quantizing routines provides n-bit expansion, while a second of said quantizing routines provides m-bit expansion, said m-bit expansion different in bit length from said n-bit expansion.

12. The apparatus of claim 11 wherein said n-bit compaction results in compression of each input data to 2-bits in length; and wherein said m-bit compaction results in compression of each input data to 3-bits in length.

13. The apparatus of claim 12 further comprising sampling means for sampling said first inputted analog signal prior to quantization, such that said first adjusted difference signal is equally divided into three 8-bit segments by said sampling means prior to quantization.

14. The apparatus of claim 13 wherein each of said three 8-bit segments is quantized into 3-bit, 2-bit and 3-bit compressions using each said n-bit and m-bit and n-bit compactions respectively, such that the first segment of said three 8-bit segments is compressed into a 3-bit segment, the second segment of said three 8-bit segments is compressed into a 2-bit segment, and the third segment of said three 8-bit segments is compressed into a 3-bit segment; and wherein all three compressed segments are returned to said three 8-bit segments using each said n-bit and m-bit expansion during inverse quantization.

15. The apparatus of claim 14 wherein said quantizer means uses a gaussian distribution function having a standard deviation value of approximately 0.14 to quantize said first adjusted difference signal for said n-bit compaction and a standard deviation value of approximately 0.15 for said m-bit compaction.

16. In a computer for processing a digital audio signal, a method for compressing said digital audio signal into a compressed signal, storing said compressed signal in a memory, retrieving said compressed signal from said memory and expanding said compressed signal to reconstructed said digital audio signal for real-time playback, comprising the steps of:

providing a first predicted signal;

adding said first predicted signal to a first inputted digital audio signal to provide a first difference signal which is the difference between said first predicted signal and said first inputted digital audio signal;

adjusting a first gain on said first difference signal to provide a first gain adjusted signal;

normalizing said first gain adjusted signal to provide a first adjusted difference signal;

quantizing said first adjusted difference signal in order to provide a compressed signal which corresponds to a quantized compression of said first inputted digital audio signal;

storing said compressed signal in said memory for later retrieval;

evaluating said compressed signal to determine if said compressed signal is at a predetermined value in order to automatically control an amount of gain to be applied to a second inputted digital audio signal;

retrieving said compressed signal from said memory for future real-time playback;

expanding said compressed signal in an inverse quantizer to provide an expanded signal which is substantially equivalent to said first adjusted difference signal;

denormalizing said expanded signal to provide a second adjusted difference signal substantially equivalent to said first gain adjusted signal;

applying a second gain to said second adjusted difference signal to provide a second gain adjusted signal substantially equivalent to said first difference signal;

adding said second gain adjusted signal to said first predicted signal to provide a first outputted digital audio signal substantially equivalent to said first inputted digital audio signal, wherein said first outputted digital audio signal is outputted available for in time for real-time playback.

17. The method of claim 16 further comprising the step of:

generating a second predicted signal from said first outputted digital signal.

18. The method of claim 17 wherein the steps of adjusting and normalizing are accomplished simultaneously.

19. The method of claim 18 wherein the steps of denormalizing and applying are accomplished simultaneously.

20. The method of claim 19 wherein the steps of adjusting and applying are accomplished with logarithmic addition.

21. The method of claim 20 wherein the steps of normalizing and denormalizing are accomplished with shifting to adjust a signal for normalization and denormalization, respectively.

* * * * *